United States Patent [19]

Takeda et al.

[11] 4,019,137
[45] Apr. 19, 1977

[54] MOVING COIL TYPE INSTRUMENT

[75] Inventors: Shoji Takeda; Yutaka Sugawara, both of Musashino, Japan

[73] Assignee: Yokogawa Electric Works, Ltd., Tokyo, Japan

[22] Filed: Dec. 19, 1975

[21] Appl. No.: 642,657

[30] Foreign Application Priority Data

Dec. 26, 1974 Japan .......................... 50-2600[U]

[52] U.S. Cl. ............................ 324/150; 324/154 R
[51] Int. Cl.² ...................... G01R 5/08; G01R 1/02
[58] Field of Search ......... 324/154 R, 154 PB, 150, 324/155

[56] References Cited

UNITED STATES PATENTS

| | | | |
|---|---|---|---|
| 3,277,370 | 10/1966 | Clark | 324/154 R |
| 3,317,837 | 5/1967 | Takeda et al. | 324/154 R |
| 3,551,812 | 12/1970 | Mothes | 324/154 R X |
| 3,597,686 | 8/1971 | Kain et al. | 324/154 R |
| 3,681,692 | 8/1972 | Haas et al. | 324/154 R |
| 3,878,462 | 4/1975 | Orth et al. | 324/154 |

*Primary Examiner*—Gerard R. Strecker
*Attorney, Agent, or Firm*—Parmelee, Johnson & Bollinger

[57] ABSTRACT

A long-scale moving coil instrument of the type comprising a frame, means including an arcuate core member secured to the frame for forming a magnetic circuit path, and a mounting member carrying a moving coil over the core member and being suspended for rotation relative to the frame by means of tension bands secured to bosses on the mounting member. The instrument is characterized by a pair of boss-stoppers made of an elastic, electrically insulating material. Each boss-stopper supports a tension spring, lies in a through-hole provided in the frame, and has a central passage through which the tension bands extend for connection to the tension springs, the passages additionally receiving the bosses on the coil mounting member to limit movement thereof. With this arrangement, electrical connections to the moving coil may be effected by means of the tension bands while maintaining the electrical connections isolated from the frame with the electrically insulating boss-stoppers. The boss-stoppers are press-fitted into the through-holes, and thus may be accurately aligned and dimensionally stable. The bosses on the mounting member are formed integrally therewith for added dimensional stability. In addition, the moving coil and pointer are diametrically opposite to one another and the pointer carries an adjustable counterbalancing weight which may be light and still sufficient to provide counterbalance, so that the weight of the whole moving element can be reduced to improve the dynamic characteristics of the instrument.

1 Claim, 7 Drawing Figures

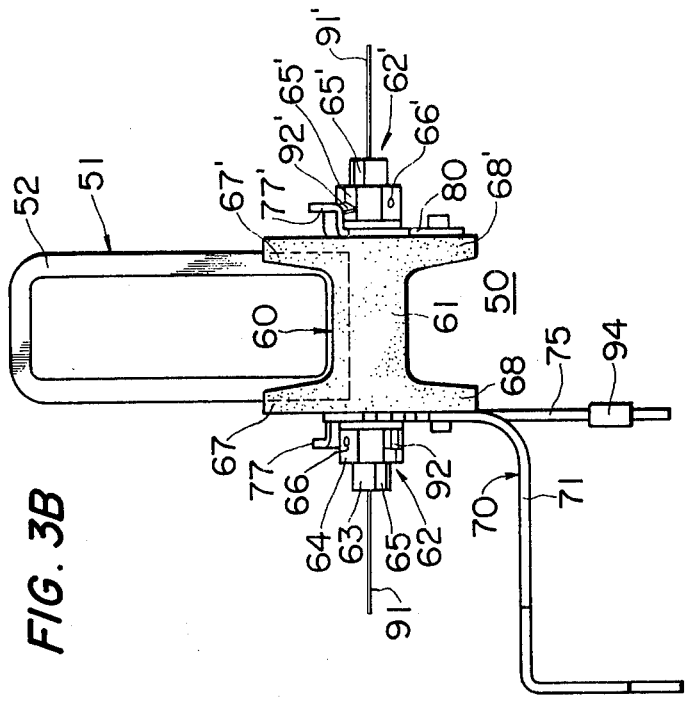
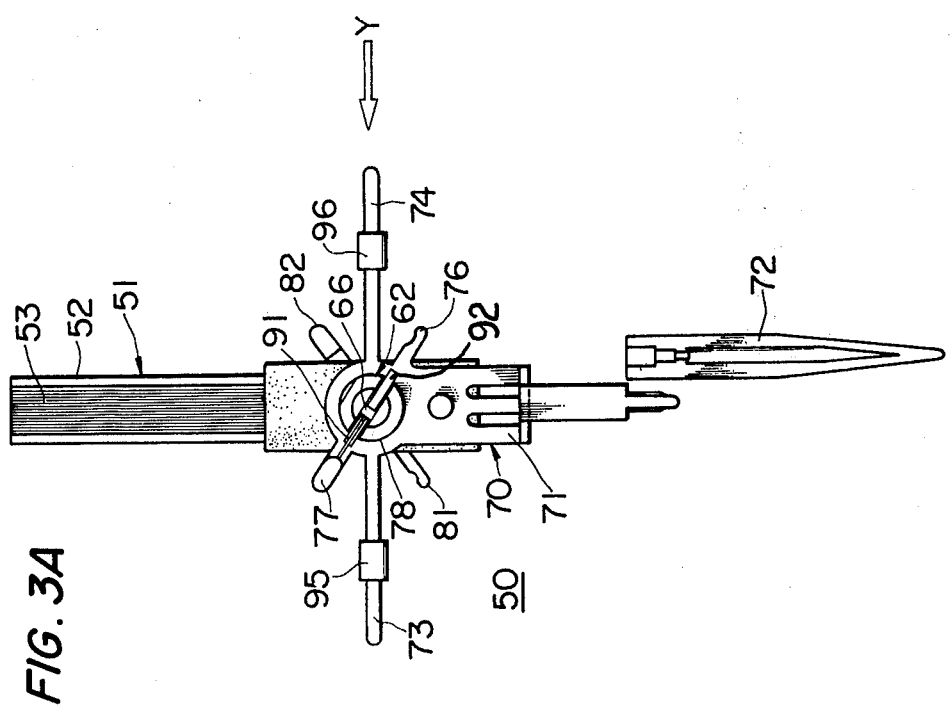

MOVING COIL TYPE INSTRUMENT

BACKGROUND OF THE INVENTION

1. Field of the Invention

This invention relates to electrical meters and instruments, and more particularly to long-scale moving coil instruments of the type suspending the moving coil between upper and lower tension bands.

2. Description of the Prior Art

Moving coil instruments for measuring and indicating an electrical quantity upon a scale as an analog are well known. Recently, digital techniques have spawned an increasing number and variety of digital voltmeters capable of digitally measuring and indicating a voltage or other electrical quantity. Although digital instruments can offer greater accuracies, a substantial need exists for moving coil meters if they can be manufactured economically, and with satisfactory accuracy. Prior art techniques have failed to provide satisfactory ways to minimize the number of parts in a moving coil type instrument and to simplify assembly and adjustment steps in production, and thus have been unable to realize a moving coil instrument with satisfactory economy and accuracy.

SUMMARY OF THE INVENTION

It is a principal object of the present invention to provide an improved long-scale, moving coil instrument of the tension band suspension type. Further objects are to provide such a moving coil type instrument with a reduced number of parts, simplified assembly and adjustment steps, and the capability of being manufactured on a mass production basis. Still other objects of the invention are to provide such instruments with high accuracy, improved dynamic characteristics, and uniformity free from assembly variations.

In a preferred embodiment of the invention to be described hereinbelow in detail, the moving coil instrument comprises a frame, means including an arcuate core member secured to the frame for forming a magnetic circuit path, and a mounting member carrying a moving coil over the core member and being suspended for rotation relative to the frame by means of tension bands. Bosses are provided on the coil mounting member, and a pair of boss-stoppers made of an elastic, electrically insulating material lie in through-holes provided in the frame. Each boss stopper supports a tension spring and has a central passage through which the tension bands extend for connection to said tension springs, the passages additionally receiving the bosses on the coil mounting member to limit movement thereof. This arrangement is advantageous because electrical connections to the moving coil may be effected by means of the tension bands, while maintaining the electrical connections electrically isolated from the frame by means of the electrically insulating boss-stoppers. The arrangement further is advantageous because the boss-stoppers may be press-fitted into a die-cast frame with simplified assembly and reliable repeatable positioning.

In other aspects of the invention, the coil mounting member and the bosses formed thereon are made integrally from an electrically insulating material to reduce assembly steps and provide dimensional stability. In addition, the moving coil and pointer are diametrically opposite to one another, and the pointer carries an adjustable counterbalancing weight, which may be light yet provide sufficient counterbalance, thereby reducing the weight of the moving element to improve the dynamic characteristics of the moving coil instrument.

Other objects, aspects and advantages of the invention will be pointed out in, or apparent from, the detailed description hereinbelow considered together with the following drawings.

DESCRIPTION OF THE DRAWING

FIG. 3A is a plan view showing the construction of the moving element used in the instrument of FIGS. 1A and 1B; and FIG. 3B is an elevational view of the moving element of FIG. 3A as seen from the direction of arrow Y.

DESCRIPTION OF THE PREFERRED EMBODIMENT

Figure 1A:
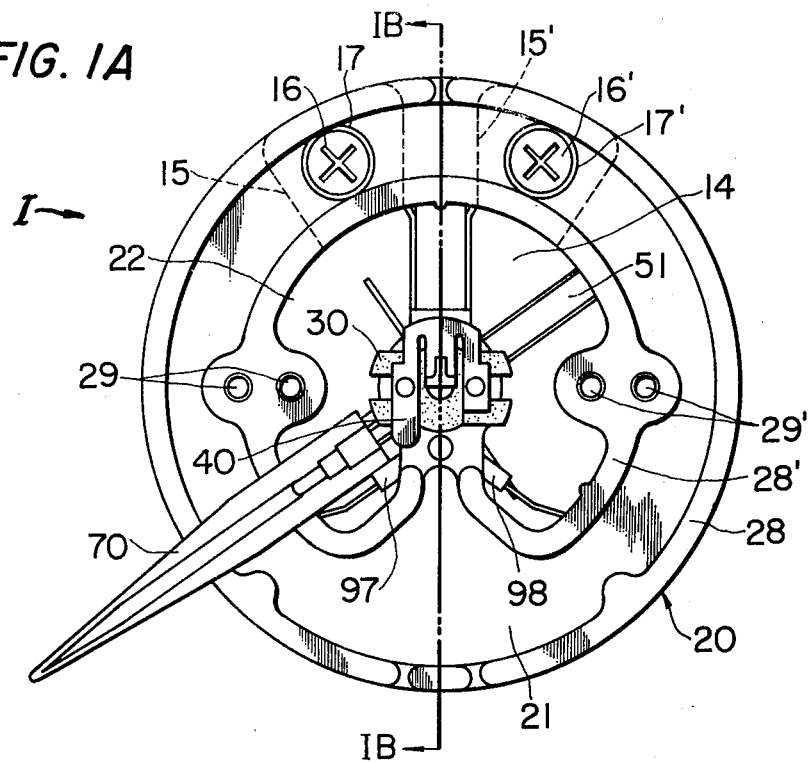
FIG. 1A is a plan view showing a moving coil type instrument according to the present invention.
Figure 1B:
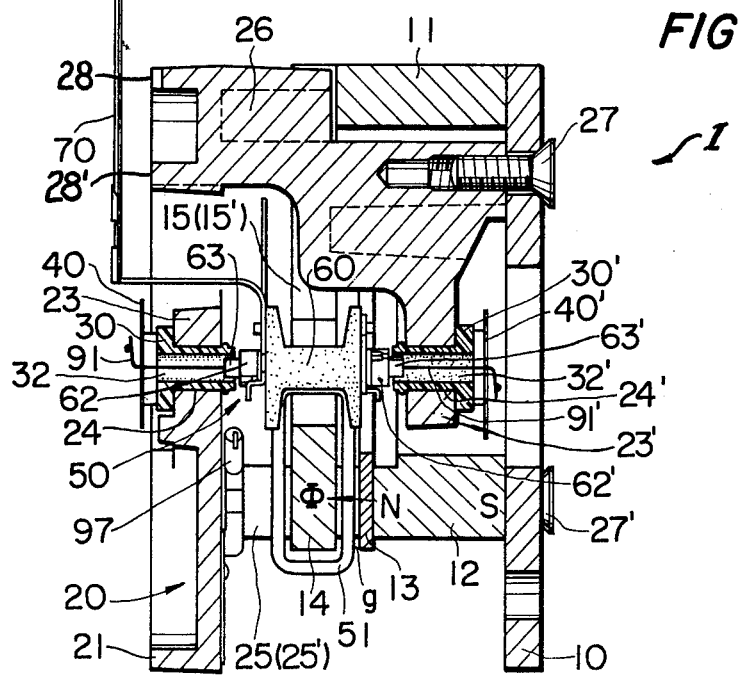
FIG. 1B is a cross-sectional view on line IB—IB of FIG. 1A.

FIGS. 1A and 1B show a moving coil type instrument I constructed in accordance with the present invention. The instrument forms a magentic circuit path with an annular magnetic path plate 10, a block 11 fitted to the magnetic path plate 10, an annular permanent magent 12 with part cut out, an arcuate pole-shoe 13 and an arcuate core 14. The pole-shoe 13 and the core 14 are nearly the same in shape, and the core 14 has legs 15 and 15'. The permanent magnet 12 is fastened to the magnetic path plate 10 so that its cut-out part faces the block 11. The pole-shoe 13 is fastened to the permanent magnet 12, and the core 14 has its legs 15 and 15' connected to the block 11 with screws 16 and 16'. The magnetic path plate 10, the permanent magnet 12, the pole-shoe 13 and the core 14 are located concentrically with respect to their annular portions. The permanent magnet 12 has N and S poles as shown in FIG. 1B, and its magnetic flux $\Phi$ passes through the pole-shoe 13, across the gap $g$ formed between the pole-shoe 13 and the core 14 and through the block 11 and the magnetic path plate 10.

The instrument I carries the magnetic path plate 10 upon a die-cast frame 20 formed with an approximately annular frontal portion 21 having a U-shaped cross-section. This annular frontal portion 21 has a through-hole 22, toward the center of which the frame extends a mounting arm 23. The arm 23 has a through-hole 24 to receive a boss-stopper 30 as described below. The frame 20 extends another mounting arm 23' to a position opposite arm 23. The arm 23' has a through-hole 24' concentric with the through-hole 24, to receive a second boss-stopper 30' as described below. Together, the boss-stoppers 30 and 30' mount the instrument's moving element 50 therebetween, in a manner to be described below. Legs 25 and 25' are formed integrally with the annular portion 21. (The leg 25 is not depicted in FIG. 1). The frame 20 can readily be mounted to the magnetic path plate 10 at its body portion 26 with a screw 27, as well as at its leg 25 (25') with a screw 27'. The annular frontal portion 21 of the frame 20 has outer and inner flanges on rims 28 and 28', and the inner rim 28' has holes 29 and 29' for mounting a scale plate (not shown) with screws. Through-holes 17 and 17' are provided in the annular portion 21 to meet screws 16 and 16' respectively.

Figure 2A:
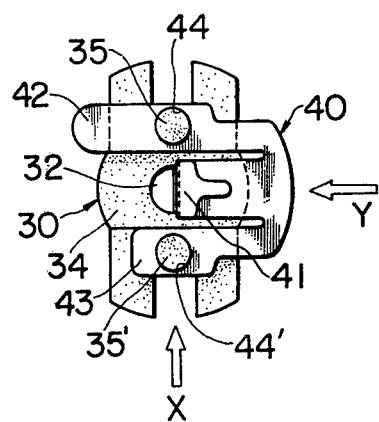
FIG. 2A is a plan view showing the construction of the boss-stopper used in the instrument of FIGS. 1A and 1B.
Figure 2C:
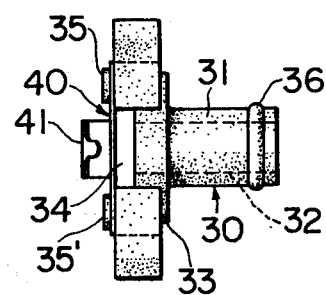
FIGS. 2B and 2C are elevational views of the boss-stopper of FIG. 2A as seen from the directions of arrows X and Y respectively.
Figure 2B:
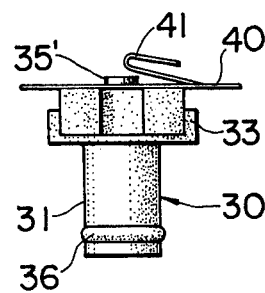

The boss-stopper 30 in mounting arm 23 is made of an elastic, electrically insulating material, such as plastic, and mounts a tension spring 40. As shown in FIGS. 2A, 2B and 2C, the boss-stopper 30 has an approximately T-shaped cross section, and its tubular body part 31 has a through-hole 32. A groove 34 is formed in the center of its head 33, and circular lugs 35 and 35' are formed at the two end portions of head 33. At the end of the body part 31 is a raised rib portion 36 formed in the circumferential direction. The tension spring 40 is nearly E-shaped, with its central leg 41 raised upwardly to form a resilient tongue. The side legs 42 and 43 of the tension spring 40 have through-holes 44 and 44'. The circular lugs 35 and 35' on the head 33 of the boss-stopper 30 are fitted into the holes 44 and 44' respectively and supersonically riveted whereby the tension spring 40 is fastened integrally to the boss-stopper 30. The central tongue 41 of the tension spring 40 is located above the groove 34 on the head 33 of the boss-stopper 30 and its folded end is aligned with the center of the through-hole 32.

The boss-stopper 30 equipped with the tension spring 40 is fitted into the through-hole 24 formed in the mounting arm 23 of the frame 20 as shown in FIG. 1B, and is retained there by the raised rib portion 36. The boss-stopper 30' and its tension spring 40' are constructionally the same as the boss-stopper 30 and tension spring 40, and are fitted into the through-hole 24' formed in the arm 23' of the frame 20 in opposition to boss-stopper 30.

FIGS. 3A and 3B show the construction of the moving element 50 of instrument I, which comprises a mounting member 60 carrying a moving coil 51 and a pointer 70. The moving coil 51 includes a rectangular coil frame 52 and a coil 53 wound on the coil frame 52. The mounting member 60, made of plastic, has a central shaft 61 and bosses 62 and 62' formed integrally with the shaft at both ends. The upper boss 62 has a diametrally small portion 63 and a diametrally large portion 64. A slot 65 is formed axially along the upper boss 62 over the two diametral portions 63 and 64. A metal pin 66 is provided at the diametrally large portion 64 across the slot 65. The lower boss 62' is constructionally the same as the upper boss 62, excepting that the slots 65 and 65' differ in direction.

A pair of parallel arms 67 and 67' extend from one side of the shaft 61 of the mounting member 60, and a second pair of parallel arms 68 and 68' from the other side thereof symetrically with the arms 67 and 67'. The moving coil 51 is mounted in a U-shaped mounting frame formed by the shaft 61, and arms 67 and 67' of the mounting member 60.

The pointer 70 comprises a base 71 and an indicator point 72 secured thereto. The base 71 has a pair of opposed balancing arms 73 and 74 extending in a direction perpendicular to the direction of point 72, a balancing arm 75 extending in a direction parallel with the point 72, a tab 76 to which one end of the winding of coil 53 is electrically connected, and a tab 77 to which one end of a tension band 91 is connected. These components are constructionally integral with the base 71, being formed therewith by die-out pressing. A through-hole 78 also is formed in the base 71. The pointer 70 is mounted on the mounting member 60 with the diametrally large portion 64 of the upper boss 62 fitting into the through-hole 78, and with the indicator point 72 located opposite the moving coil 51 with respect to the shaft 61 of the mounting member 60.

On the end of mounting member 60 opposite to the pointer 70 there is mounted a tension band mounting member 80 having a tab 81 to which the other end of the winding of coil 53 is electrically connected, and a tab 82 to which one end of another tension band 91' is connected. The tension band mounting member 80 is fitted to the lower boas 62' in a manner similar to the mounting of the pointer base 71 to the upper boss 62 of mounting member 60.

Tension band 91 is led through slot 65 beneath metal pin 66 and is connected to the tab 77 by soldering or the like. A key 92 is driven into the space between the slot 65 and the metal pin 66 whereby the tension band 91 is securely fastened to the upper boss 62. Similarly, one end of the tension band 91' is connected to the lower boss 62' and fastened thereto by a key 92'.

The moving element 50 described above is mounted in relation to the frame 20, the permanent magnet 12, the core 14, and the magnetic path plate 10 as shown in FIGS. 1A and 1B. At the beginning of assembly, the frame 20 is disconnected from the magnetic circuit elements. The boss-stopper 30 is fitted into the through-hole 24 of the arm 23 formed on the frame 20. One end of the tension band 91, the other end of which is connected to the upper boss 62, is led through the through-hole 32 of the boss-stopper 30. Similarly, one end of the tension band 91', the other end of which is connected to the lower boss 62', is led through the mounting arm through-hole 24' and through the through-hole 32' of the boss-stopper 30, which is then fitted into the through-hole 24'. The diametrally small portions 63 and 63' of the upper and lower bosses 62 and 62' lie in the through-holes 32 and 32' of the boss-stoppers 30 and 30' respectively. The other ends of the tension bands 91 and 91' are fastened to the tongues 41 and 41' of the tension springs 40 and 40' respectively, by soldering or the like, while the tension bands 91 and 91' are held under a given tension. The frame 20 then is secured to the magnetic circuit elements, being fastened to the magnetic path plate 10 with screws 27 and 27'. The core 14 is inserted into the moving coil 51 by way of its cut-out portion. The legs 15 and 15' of the core 14 are fastened to the magnetic path block 11 with screws 16 and 16'.

In the moving coil type instrument I described above, the current to be measured flows to and from the coil 53 by way of the tension bands 91 and 91' and the upper and lower tension springs 40 and 40'. This current interacts with the flux $\Phi$ of the permanent magnet 12 across the gap $g$ to cause the moving element 50 to rotate to cause the pointer to swing to indicate the measured current on the scale. Balance of the swinging pointer is obtained, as shown in FIG. 3B, by means of a weight 94 attached to the balancing arm 75 to balance the weight of the pointer portion 70 with that of the moving coil 51 about the axis of tension bands 91 and 91'. Similarly, weights 95 and 96 attached to the balancing arms 73 and 74 adjust the balance of the moving element 50 in the transverse direction.

In the illustrated instrument construction, the moving element is able to rotate through an angle of 270° about the core 14. As shown in FIGS. 1A and 1B, stoppers 97 and 98 installed on the back of the annular portion 21 limit the rotating range of the moving element 50.

The moving coil type instrument of the present invention has a number of distinctive and advantageous features, among which are:

a. The upper and lower boss-stoppers are made of an elastic, electrically insulating material such as plastic which can be press-fitted into through-holes provided on the mounting arms of the frame to mount the boss-stoppers on the frame. This obviates the need for an extra mounting means, thus reducing the number of parts required. Still further, because the two boss-stoppers can be mounted on the frame by simply inserting them in through-holes without the aid of other components, the distance between the two boss-stoppers can be made constant in any meter unit being produced, with the result that variations due to the assembly process are precluded.

b. As described, the electrical current to be measured is supplied to the moving coil through the tension springs secured to the boss-stoppers. Accordingly, the tension springs must be electrically isolated from the other component members. This need is met according to the invention without depending on any extra means for isolation because the boss-stoppers, which limit the moving range of the upper and lower bosses, are made of an electrically insulating material. Again, the number of necessary parts can be reduced.

c. The upper and lower bosses are formed integrally with the coil mounting means using an insulating material such as plastic, as opposed to prior art constructions in which, for example, the bosses are made of aluminum, the coil mounting means is made of plastic, and the bosses are joined to the coil mounting means by caulking or the like, which involves an extra number of assembly steps and leads to higher production cost. Furthermore, caulking readily causes variations in the distance between the bosses, requiring intricate adjustment. In contrast, in the present invention, because the bosses are formed integrally with the coil mounting means, the efficiency of assembly is markedly improved and variations due to the assembly process are removed.

d. The pointer is located opposite to the coil with respect to the axis of rotation of the moving element 50. If the pointer and the coil are on the same side of the axis, the weight 94 must be heavy to effect a counterbalance. In the present construction, however, the weight of the coil cancels that of the pointer to enable the weight 94 to be light. As a result, the weight of the whole moving element is reduced and hence the dynamic characeristics of the instrument are improved.

As described above, the instrument of the invention can be built from a minimum number of parts using a reduced number of assembly and adjustment steps. Thus a long-scale, moving coil type instrument of the type using a tension band suspension system can be manufactured in accordance with the present invention at a lower cost and on a mass-production basis, unlike digital instruments.

Although a specific embodiment of the invention has been disclosed herein in detail, it is to be understood that this is for the purpose of illustrating the invention, and should not be construed as necessarily limiting the invention, since it is apparent that many changes can be made to the disclosed structures by those skilled in the art to suit particular applications.

We claim:

1. A moving coil type instrument comprising: an annular magnetic path plate; a frame attached to said magnetic path plate, the frame having two arms each having a through-hole; a pair of boss-stoppers made of an elastic, electrically insulating material, each having an approximately T-shaped cross-section and a through-hole along the axis and equipped with a tension spring at the head thereof, each boss-stopper being fitted in the through-hole of each arm of said frame; a mounting member made of an elastic, electrically insulating material, mounting a pointer and a moving coil mounting frame and having a pair of integral bosses of said electrically insulating material with each boss having diametrally small and large portions, each boss being attached to an end of a tension band, the moving coil and the pointer being diametrically opposite to each other with respect to the axis of the two bosses; an annular permanent magnet with part cut out, attached to said magnetic path plate; and a core installed opposite said permanent magnet across a gap, thus forming a magnetic path with said magnetic path plate, the core being surrounded with said moving coil; the other ends of said tension bands being connected to said tension springs so that the diametrally small portions of said bosses sit in said boss-stoppers respectively.

* * * * *